United States Patent
Lim et al.

(10) Patent No.: US 12,255,094 B2
(45) Date of Patent: Mar. 18, 2025

(54) SEMICONDUCTOR DEVICE

(71) Applicant: Samsung Electronics Co., Ltd., Suwon-si (KR)

(72) Inventors: Jun Hyuk Lim, Hwaseong-si (KR); Jong Min Baek, Seoul (KR); Deok Young Jung, Seoul (KR); Sung Jin Kang, Seoul (KR); Jang Ho Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 500 days.

(21) Appl. No.: 17/739,114

(22) Filed: May 7, 2022

(65) Prior Publication Data

US 2022/0392800 A1 Dec. 8, 2022

(30) Foreign Application Priority Data

Jun. 2, 2021 (KR) .................. 10-2021-0071632

(51) Int. Cl.
*H01L 23/522* (2006.01)
*H01L 21/768* (2006.01)
*H01L 21/8234* (2006.01)

(52) U.S. Cl.
CPC .. *H01L 21/76829* (2013.01); *H01L 21/76816* (2013.01); *H01L 21/76841* (2013.01); *H01L 21/76877* (2013.01); *H01L 21/823468* (2013.01); *H01L 23/5226* (2013.01)

(58) Field of Classification Search
CPC .......... H01L 23/5226; H01L 21/76829; H01L 21/76841; H01L 21/76816; H01L 21/76877; H01L 21/823468
See application file for complete search history.

(56) References Cited

U.S. PATENT DOCUMENTS

| | | | |
|---|---|---|---|
| 6,566,242 B1 | 5/2003 | Adams et al. | |
| 8,580,689 B2 | 11/2013 | Ichimaru et al. | |
| 9,054,109 B2 | 6/2015 | Lin et al. | |
| 2005/0054204 A1 | 3/2005 | Yu | |
| 2022/0392800 A1* | 12/2022 | Lim | H01L 21/823468 |

FOREIGN PATENT DOCUMENTS

| | | |
|---|---|---|
| JP | 2000208612 A | 7/2000 |
| JP | 2014038968 A | 2/2014 |
| KR | 20050073308 A | 7/2005 |
| KR | 20050112997 A | 12/2005 |
| KR | 20190071829 A | 6/2019 |

* cited by examiner

*Primary Examiner* — Mark V Prenty
(74) *Attorney, Agent, or Firm* — Muir Patent Law, PLLC

(57) ABSTRACT

There is provided a semiconductor device including an etching stop film which is placed disposed on a substrate; an interlayer insulating film which is disposed on the etching stop film; a trench which penetrates the interlayer insulating film and the etching stop film; a spacer which extends along side walls of the trench; a barrier film which extends along the spacer and a bottom surface of the trench; and a filling film which fills the trench on the barrier film. The trench includes a first trench and a second trench which are spaced apart from each other in a first direction and have different widths from each other in the first direction. A bottom surface of the second trench is placed disposed below a bottom surface of the first trench.

20 Claims, 16 Drawing Sheets

SEMICONDUCTOR DEVICE

This application claims priority under 35 U.S.C. § 119 to Korean Patent Application No. 10-2021-0071632 filed on Jun. 2, 2021 in the Korean Intellectual Property Office, the disclosure of which is incorporated herein by reference in its entirety.

BACKGROUND

1. Field of the Disclosure

The present disclosure relates to a semiconductor device.

2. Description of the Related Art

As down-scaling of semiconductor elements have progressed rapidly in recent years due to the development of electronic technology, high integration and low power consumption of semiconductor chips are required. Feature sizes of semiconductor devices are continuously decreasing to cope with the demands for high integration and low power consumption of the semiconductor chips. A distance between wirings decreases accordingly.

SUMMARY

Aspects of the present disclosure provide a semiconductor device having improved product reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising an etching stop film which is placed disposed on a substrate; an interlayer insulating film which is disposed on the etching stop film; a trench which penetrates the interlayer insulating film and the etching stop film; a spacer which extends along side walls of the trench; a barrier film which extends along the spacer and a bottom surface of the trench; and a filling film which fills the trench on the barrier film. The trench includes a first trench and a second trench which are spaced apart from each other in a first direction and have different widths from each other in the first direction. A bottom surface of the second trench is placed disposed below a bottom surface of the first trench.

According to an aspect of the present disclosure, there is provided a semiconductor device comprising a first interlayer insulating film which includes a via; an etching stop film which is placed disposed on the first interlayer insulating film; a second interlayer insulating film which is placed disposed on the etching stop film; a first trench which penetrates at least a part of the second interlayer insulating film and the etching stop film, and includes a first recess which is convex toward the etching stop film between the first interlayer insulating film and the second interlayer insulating film; a first spacer which extends along side walls of the first trench and fills the first recess; and a first wiring which fills the first trench on the first spacer. The first spacer is disposed between the second interlayer insulating film and the first wiring, and is not disposed between the first interlayer insulating film and the first wiring.

According to an aspect of the present disclosure, there is provided a semiconductor device comprising a first interlayer insulating film which includes a via; an etching stop film which is disposed on the first interlayer insulating film; a second interlayer insulating film which is disposed on the etching stop film; a first trench which penetrates the second interlayer insulating film and the etching stop film, and includes a first recess that is convex toward the etching stop film between the first interlayer insulating film and the second interlayer insulating film; a second trench which is spaced apart from the first trench in a first direction, penetrates at least a part of the second interlayer insulating film, the etching stop film and the first interlayer insulating film, and includes a second recess that is convex toward the etching stop film between the first interlayer insulating film and the second interlayer insulating film; a first spacer which extends along side walls of the first trench and fills the first recess; a first barrier film which extends along the first spacer and a bottom surface of the first trench exposed by the first spacer; a first filling film which fills the first trench on the first barrier film; a second spacer which extends along side walls of the second trench and fills the second recess; a second barrier film which extends along the second spacer and a bottom surface and side walls of the second trench exposed by the second spacer; and a second filling film which fills the second trench on the second barrier film. A width of the first trench in the first direction is smaller than a width of the second trench. The bottom surface of the first trench is disposed above the bottom surface of the second trench. At a first height point from the etching stop film, a thickness of the first spacer on the side walls of the first trench is greater than a thickness of the second spacer on the side walls of the second trench.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION

Figure 1:
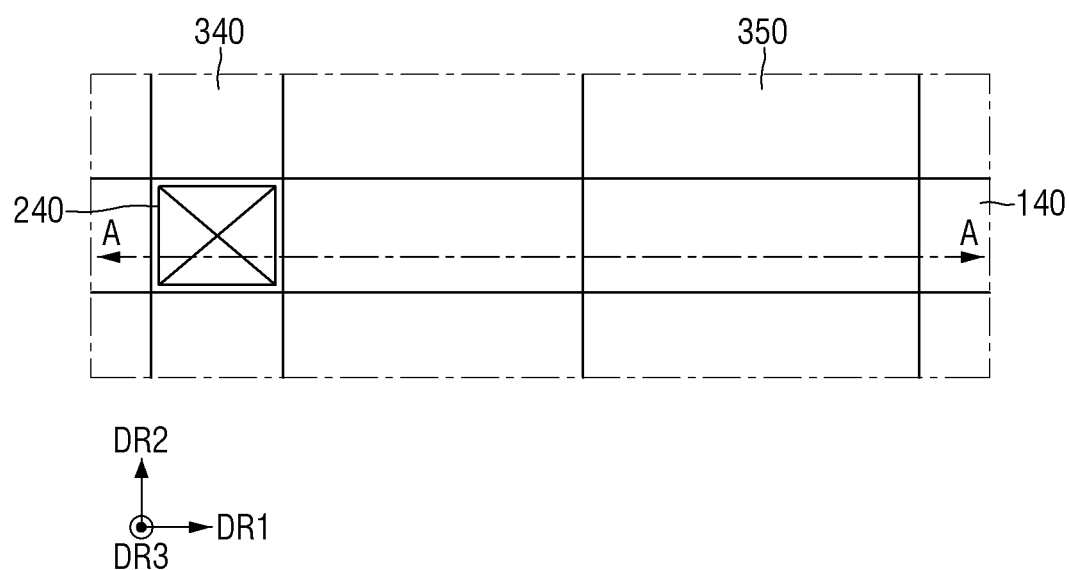
FIG. 1 is a schematic layout diagram for explaining a semiconductor device according to some embodiments.
Figure 2:
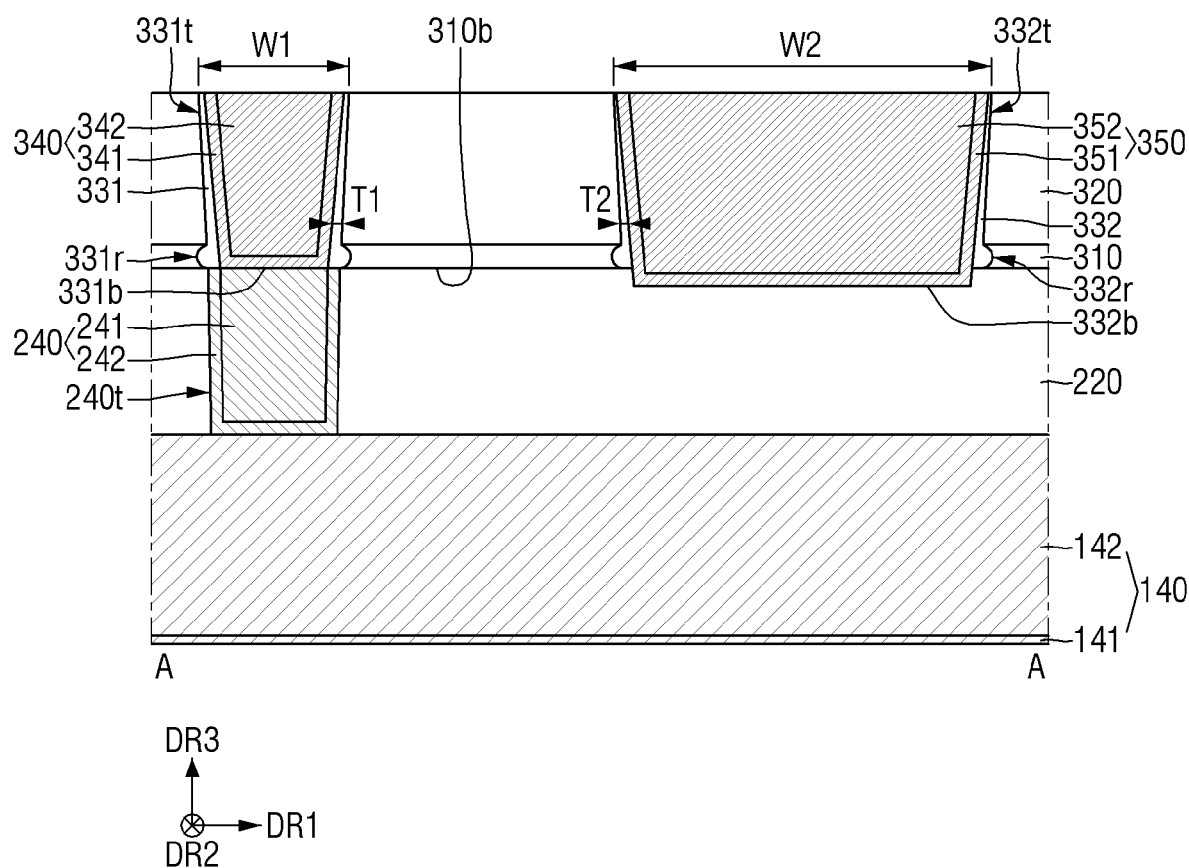
FIG. 2 is a cross-sectional view taken along A-A of FIG. 1 according to some embodiments.

FIG. 1 is a schematic layout diagram for explaining a semiconductor device according to some embodiments. FIG. 2 is a cross-sectional view taken along A-A of FIG. 1 according to some embodiments.

Referring to FIGS. 1 and 2, the semiconductor device according to some embodiments may include a lower wiring 140, a via 240, and first and second upper wirings 340 and 350.

The lower wiring 140 may extend in a direction in which it intersects the first and second upper wirings 340 and 350. For example, the lower wiring 140 may extend in a first direction DR1, and the first and second upper wirings 340 and 350 may extend in a second direction DR2. The second direction DR2 may be a direction that intersects the first direction DR1.

The lower wiring 140 and the via 240 may be, for example, a contact or a contact wiring formed in a MOL (Middle-of-Line) process. Alternatively, the lower wiring 140 may be a connecting wiring formed in a BEOL (Back-end-of-line) process, and the via 240 may be a via formed in the BEOL process.

The first and second upper wirings 340 and 350 may be spaced apart from each other in the first direction DR1. A width of the first upper wiring 340 in the first direction DR1 may differ from a width of the second upper wiring 350. The width of the first upper wiring 340 in the first direction DR1 may be smaller than the width of the second upper wiring 350.

The first and second upper wirings 340 and 350 may be in contact with the via 240, and the via 240 may be in contact with the lower wiring 140. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Therefore, the first and second upper wirings 340 and 350 may be electrically connected to the lower wiring 140 through the via 240. Although FIG. 2 shows that the first upper wiring 340 is connected to the lower wiring 140 through the via 240, the present disclosure is not limited thereto.

According to some embodiments, the lower wiring 140, the via 240 and the first and second upper wirings 340 and 350 may be formed by a single damascene process.

The lower wiring 140 may include a lower barrier film 141 and a lower filling film 142. The lower filling film 142 may be formed on the lower barrier film 141.

A first interlayer insulating film 220 may be disposed on the lower wiring 140. The first interlayer insulating film 220 may include a via trench 240t. The via trench 240t may penetrate the first interlayer insulating film 220 to expose at least a part of the upper surface of the lower wiring 140.

The via 240 may fill the via trench 240t. The via 240 may be in contact with the lower wiring 140. The via 240 may include a via barrier film 242 and a via filling film 241.

The via barrier film 242 may extend along side walls and a bottom surface of the via trench 240t. The via barrier film 242 may be conformally formed, for example, along the profile of the via trench 240t. The via filling film 241 may fill the via trench 240t on the via barrier film 242.

An etching stop film 310 may be disposed on the first interlayer insulating film 220. The etching stop film 310 according to some embodiments may be a single layer. The etching stop film 310 may include or be formed of, for example, an aluminum (Al) element.

The second interlayer insulating film 320 may be disposed on the etching stop film 310. The second interlayer insulating film 320 may include a first trench 331t and a second trench 332t.

Each of the first interlayer insulating film 220 and the second interlayer insulating film 320 may include or be formed of, for example, at least one of silicon oxide (SiOx), silicon nitride (SiN), silicon oxynitride (SiON) and a low dielectric constant material.

For example, each of the first interlayer insulating film 220 and the second interlayer insulating film 320 may include or be formed of a low dielectric constant material to reduce a coupling phenomenon between the conductive patterns. The low dielectric constant material may be, for example, a silicon oxide having an appropriately high carbon and hydrogen, and may be a material such as Si, C, O, and H (SiCOH).

On the other hand, since carbon is contained in the insulating material, the dielectric constant of the insulating material may be lowered. However, in order to further lower the dielectric constant of the insulating material, the insulating material may include a pore such as a cavity in which the insulating material is filled with gas or filled with air.

The low dielectric material may include or be formed of, for example, but is not limited to, Fluorinated TetraEthyl-OrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof.

The first trench 331t and the second trench 332t may be spaced apart from each other in the first direction DR1. A width W1 of the first trench 331t in the first direction DR1 may be different from a width W2 of the second trench 333t. The width W1 of the first trench 331t in the first direction DR1 may be smaller than the width W2 of the second trench 333t. The width W1 of the first trench 331t and the width W2 of the second trench 333t may be values measured at the same height point from the etching stop film 310.

The first trench 331t may penetrate the second interlayer insulating film 320 and the etching stop film 310. The first trench 331t may expose at least a part of the first interlayer insulating film 220 or the via 240. For example, although the first trench 331t may expose at least a part of the upper surface of the via 240, the present disclosure is not limited thereto.

A portion of the first trench 331t that penetrates the etching stop film 310 may include a first recess 331r. The first recess 331r may be convex toward the etching stop film 310 between the first interlayer insulating film 220 and the second interlayer insulating film 320.

A first spacer 331 may be disposed on the side walls of the first trench 331t. The first spacer 331 may extend to the upper surface of the second interlayer insulating film 320 along the side walls of the first trench 331t. The first spacer 331 may fill the first recess 331r. The first spacer 331 may expose a bottom surface 331b of the first trench 331t.

According to some embodiments, a thickness T1 of the first spacer 331 on the side wall of the first trench 331t may increasingly decrease as it goes away from the first interlayer insulating film 220 (that is, in a third direction DR3).

The first upper wiring 340 may be disposed on the first spacer 331 and on the bottom surface 331b of the first trench 331t. The first upper wiring 340 may fill the first trench 331t. The first upper wiring 340 may include a first barrier film 341 and a first filling film 342.

The first barrier film 341 may extend along the first spacer 331 and the bottom surface 331b of the first trench 331t. For example, the first barrier film 341 may be conformally formed along the first spacer 331 and the bottom surface 331b of the first trench 331t. Therefore, the first spacer 331 may be disposed between the first barrier film 341, the second interlayer insulating film 320, and the etching stop film 310. The entire first barrier film 341 may be spaced apart from the second interlayer insulating film 320 by the first spacer 331.

The first filling film 342 may fill the first trench 331t on the first barrier film 341.

The second trench 332t may penetrate the second interlayer insulating film 320 and the etching stop film 310. The second trench 332t may penetrate at least a part of the first interlayer insulating film 220 or at least a part of the via 240. For example, although the second trench 332t may expose at least a part of the first interlayer insulating film 220, the present disclosure is not limited thereto.

In some embodiments, a bottom surface 332b of the second trench 332t may be disposed below the bottom surface 331b of the first trench 331t. The bottom surface 332b of the second trench 332t may be disposed below a bottom surface 310b of the etching stop film 310. The bottom surface 332b of the second trench 332t may be disposed inside the first interlayer insulating film 220.

In some embodiments, the bottom surface 331b of the first trench 331t may be disposed at the same height as the bottom surface 310b of the etching stop film 310.

A portion of the second trench 332t that penetrates the etching stop film 310 may include a second recess 332r. The second recess 332r may be convex toward the etching stop film 310 between the first interlayer insulating film 220 and the second interlayer insulating film 320.

The second spacer 332 may be disposed on the side walls of the second trench 332t. The second spacer 332 may extend to the upper surface of the second interlayer insulating film 320 along the side walls of the second trench 332t. The second spacer 332 may fill the second recess 332r. The second spacer 332 may expose the bottom surface 332b and the lower side wall of the second trench 332t. The second spacer 332 may not be disposed inside the first interlayer insulating film 220.

According to some embodiments, a thickness T2 of the second spacer 332 on the side walls of the second trench 332t may increasingly decrease as it goes away from the first interlayer insulating film 220 (that is, in the third direction DR3).

According to some embodiments, the thickness T2 of the second spacer 332 on the side walls of the second trench 332t may be smaller than the thickness T1 of the first spacer 331 on the side walls of the first trench 331t. The thickness T2 of the second spacer 332 on the side walls of the second trench 332t and the thickness T1 of the first spacer 331 on the side walls of the first trench 331t may be values measured at the same high point from the etching stop film 310.

Each of the first spacer 331 and the second spacer 332 may include or be formed of a material having an etching selectivity with respect to the etching stop film 310. Each of the first spacer 331 and the second spacer 332 may include or be formed of, for example, a low dielectric constant material. Each of the first spacer 331 and the second spacer 332 may include or be formed of, for example, at least one of silicon oxide (SiOx), silicon carbide (SiC), silicon nitride (SiN), silicon oxynitride (SiON), silicon carbonitride (SiCN), silicon carbonoxide (SiOC), and SiCOH.

The second upper wiring 350 may be disposed on the second spacer 332 and on the bottom surface 332b of the second trench 332t. The second upper wiring 350 may fill the second trench 332t. The second upper wiring 350 may include a second barrier film 351 and a second filling film 352.

The second barrier film 351 may extend along the second spacer 332 and the bottom surface 332b of the second trench 332t. For example, the second barrier film 351 may be conformally formed along the second spacer 332 and the bottom surface 332b of the second trench 332t. Therefore, the second spacer 332 may be disposed between the second barrier film 351, the second interlayer insulating film 320, and the etching stop film 310. The entire second barrier film 351 may be spaced apart from the second interlayer insulating film 320 by the second spacer 332. The second filling film 352 may fill the second trench 332t on the second barrier film 351.

Each of the via barrier film 242, the first barrier film 341 and the second barrier film 351 may include or be formed of, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh).

Each of the via filling film 241, the first filling film 342, and the second filling film 352 may include or be formed of, for example, at least one of aluminum (Al), copper (Cu), tungsten (W), and cobalt (Co).

According to some embodiments, a separation layer (500 of FIGS. 14 to 17) may be formed on both side walls of the first trench 331t and on both side walls of the second trench 332t. For example, the separation layer 500 may be formed on a second interlayer insulating film 320 that defines both side walls of the first trench 331t, an etching stop film 310 that defines the first recess 331r, a second interlayer insulating film 320 that defines both side walls of the second trench 332t, and an etching stop film 310 that defines a second recess 332r. According to some embodiments, the separation layer 500 may also be formed on the bottom surface 331b of the first trench 331t.

The separation layer 500 may include or be formed of, for example, an inhibitor which is used in inhibitor plasma, which will be described below.

When the first spacer 331 and the second spacer 332 are not formed in each of the first recess 331r and the second recess 332r, the first upper wiring 340 and the second upper wiring 350 may be formed in each of the first recess 331r and the second recess 332r. Accordingly, a distance between the first upper wiring 340 and the second upper wiring 350 in the first direction DR1 becomes shorter, and an electrical short circuit between the first upper wiring 340 and the second upper wiring 350 may occur. Further, a time dependent dielectric breakdown (TDDB) and an electromigration are induced, which may reduce the reliability of the semiconductor device.

In the semiconductor device according to some embodiments, the first spacer 331 and the second spacer 332 may fill the first recess 331r and the second recess 332r, respectively. Accordingly, it is possible to prevent an electrical short circuit between the first upper wiring 340 and the second upper wiring 350. Therefore, the time dependent dielectric breakdown (TDDB) and electromigration may be suppressed, and the reliability of the semiconductor device may be improved and/or enhanced.

In addition, the first spacer 331 and the second spacer 332 enable the first barrier film 341 and the second barrier film 351 to be formed conformally along the profiles of the first spacer 331 and the second spacer 332, and the adhesive strength of the first barrier film 341 and the second barrier film 351 may be improved.

Further, in the semiconductor device according to some embodiments, because the bottom surface 322*b* of the second trench 322*t*, which is relatively wide, is disposed below the bottom surface 311*b* of the first trench 331*t*, the second upper wiring 350 may fill the second trench 332*t*. Accordingly, a resistance of the second upper wiring 350 may be reduced, and a RC delay of the semiconductor device may be reduced.

FIGS. 3 to 9 are diagrams for explaining the semiconductor device according to some embodiments. For convenience of explanation, points different from those described using FIGS. 1 and 2 will be mainly described. For reference, FIGS. 3 to 9 are cross-sectional views taken along A-A of FIG. 1.

Figure 3:
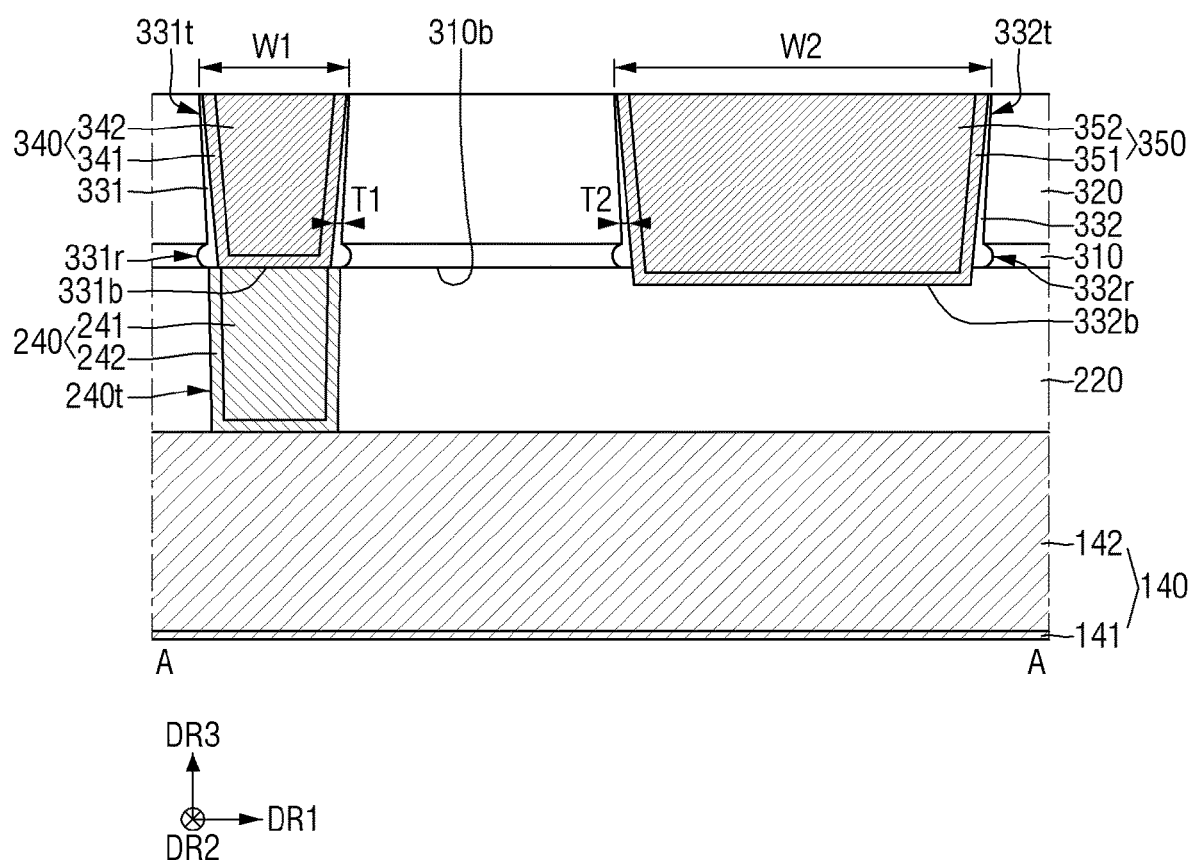
FIGS. 3 to 9 are diagrams for explaining a semiconductor device according to some embodiments.

Referring to FIG. 3, in the semiconductor device according to some embodiments, the thickness T2 of the second spacer 332 on the side walls of the second trench 332*t* may be the same as the thickness T1 of the first spacer 331 on the side walls of the first trench 331*t*. The thickness T2 of the second spacer 332 on the side walls of the second trench 332*t* and the thickness T1 of the first spacer 331 on the side walls of the first trench 331*t* may be the values that are measured at the same high point from the etching stop film 310.

Figure 4:
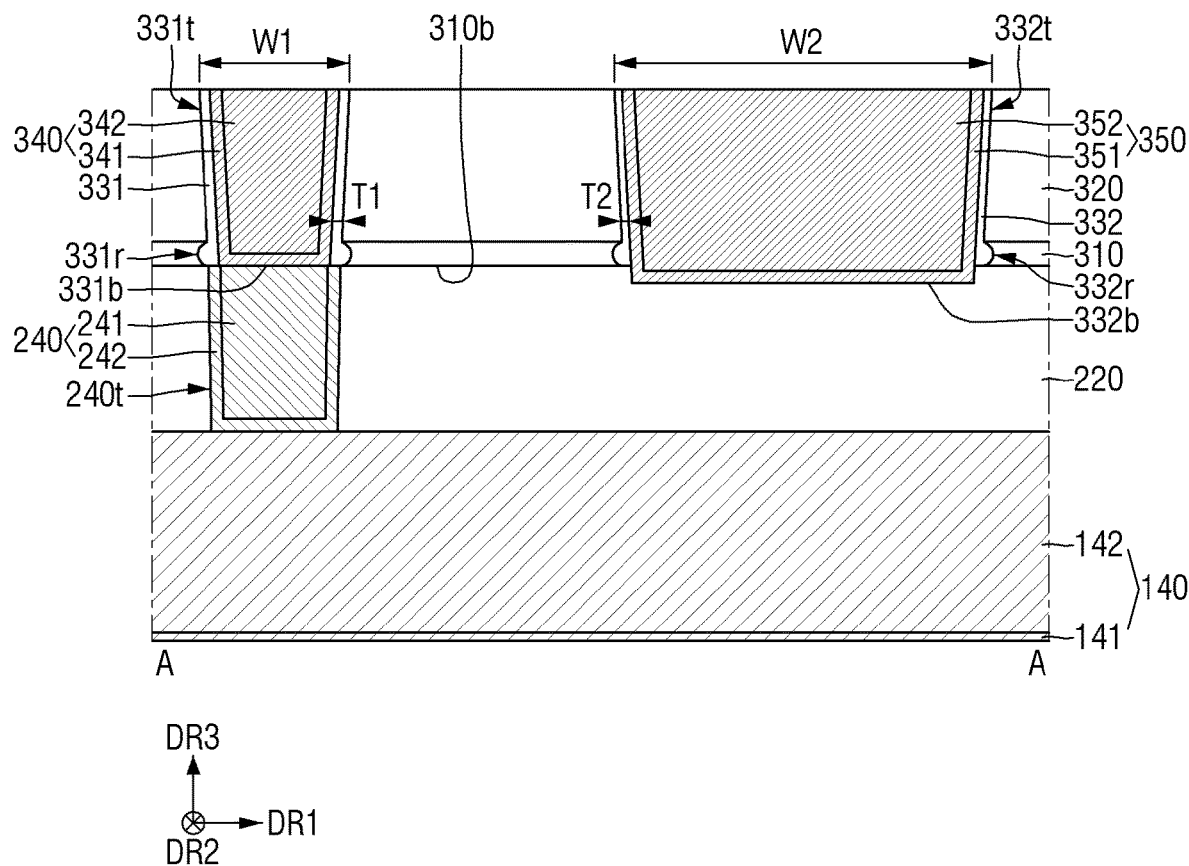

Referring to FIG. 4, in the semiconductor device according to some embodiments, the thickness T1 of the first spacer 331 on the side walls of the first trench 331*t* may be constant. The thickness T2 of the second spacer 332 on the side walls of the second trench 332*t* may be constant.

The thickness T2 of the second spacer 332 on the side walls of the second trench 332*t* may be smaller than the thickness T1 of the first spacer 331 on the side walls of the first trench 331*t*. The thickness T2 of the second spacer 332 on the side walls of the second trench 332*t* and the thickness T1 of the first spacer 331 on the side walls of the first trench 331*t* may be the values that are measured at the same high point from the etching stop film 310.

Figure 5:
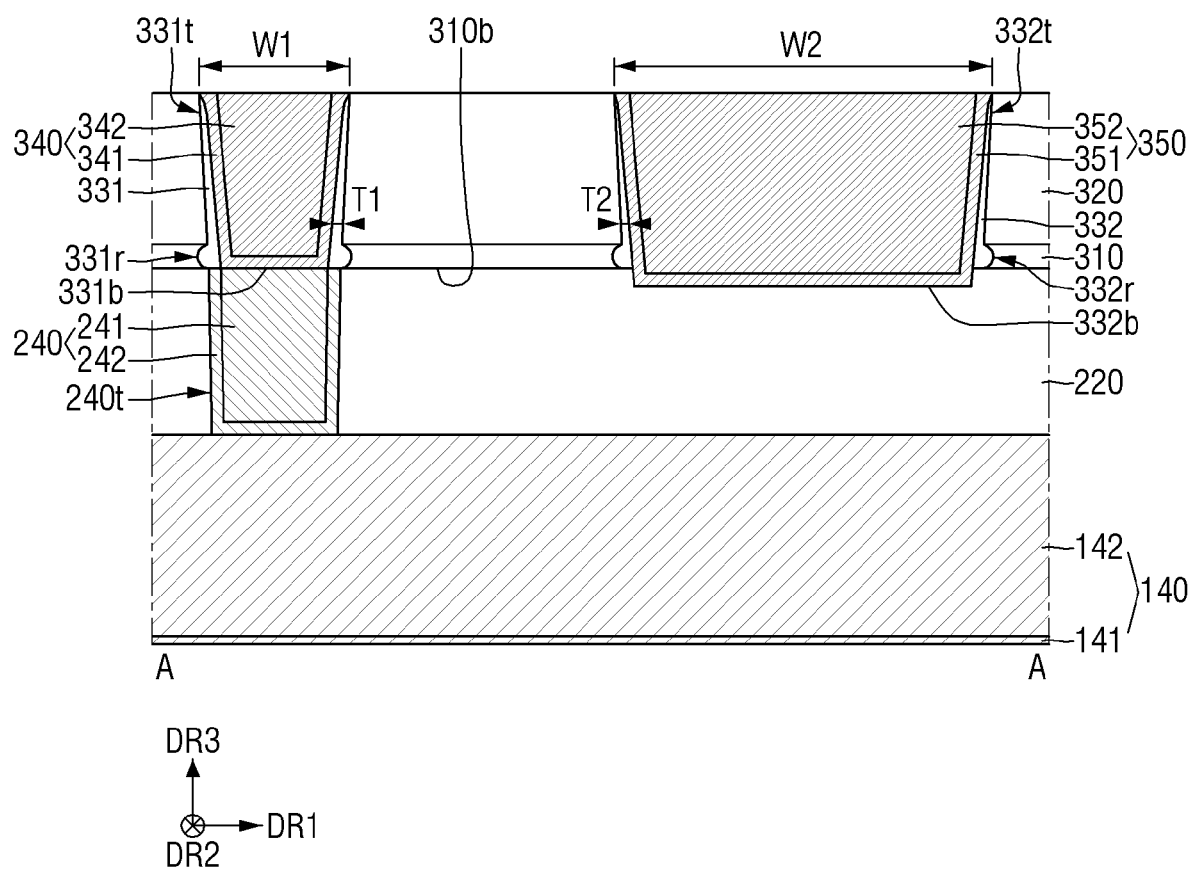

Referring to FIG. 5, in the semiconductor device according to some embodiments, upper side walls of the first spacer 331 may be rounded. Upper side walls of the second spacer 332 may be rounded.

Figure 6:
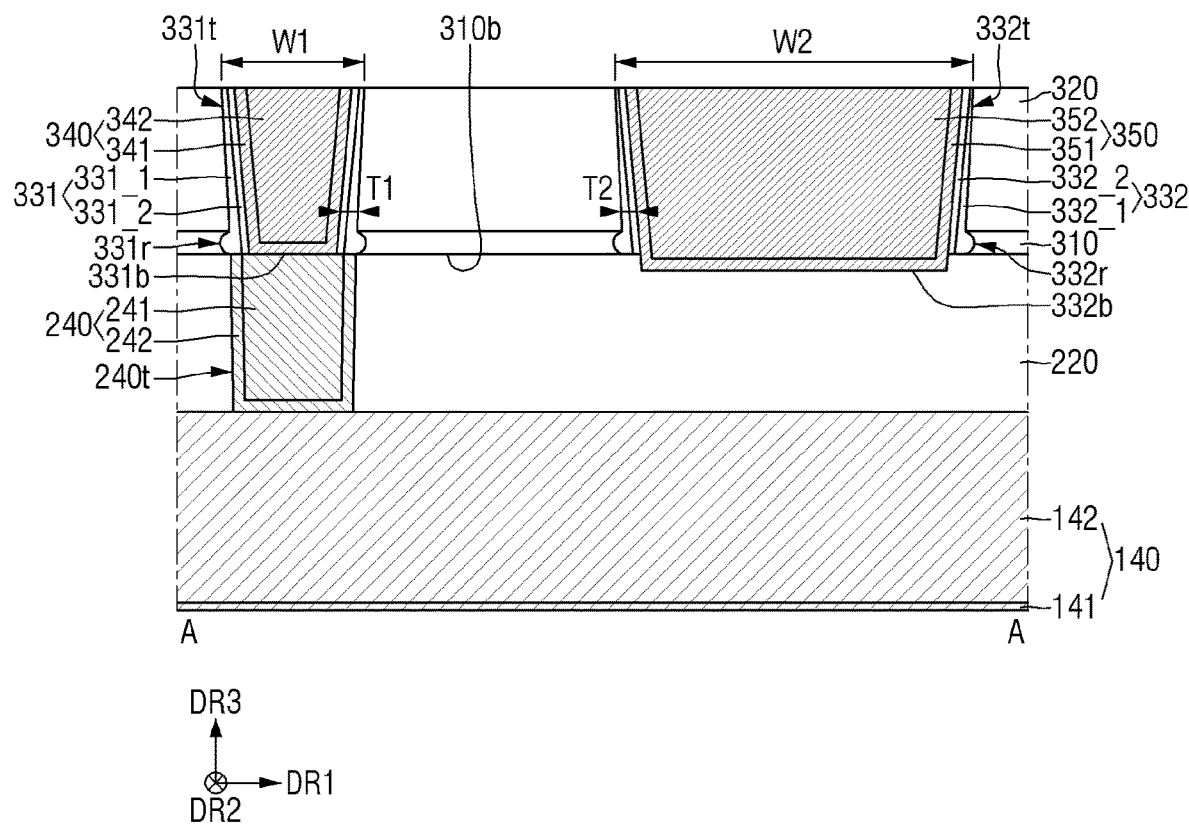

Referring to FIG. 6, in the semiconductor device according to some embodiments, at least one of the first spacer 331 and the second spacer 332 may be made up of a plurality of spacer films.

For example, the first spacer 331 may include a first spacer film 331_1 and a second spacer film 331_2. The first spacer film 331_1 may extend along the side walls of the first trench 331*t* and fill the first recess 331*r*. The second spacer film 331_2 may be formed on the first spacer film 331_1. The second spacer film 331_2 may extend along the first spacer film 331_1. The first upper wiring 340 may be disposed on the second spacer film 331_2.

The second spacer 332 may include a third spacer film 332_1 and a fourth spacer film 332_2. The third spacer film 332_1 may extend along the side walls of the second trench 332*t* and fill the second recess 332*r*. The fourth spacer film 332_2 may be formed on the third spacer film 332_1. The fourth spacer film 332_2 may extend along the third spacer film 332_1. The second upper wiring 350 may be disposed on the fourth spacer film 332_2.

For example, the first spacer film 331_1, the second spacer film 331_2, the third spacer film 332_1, and the fourth spacer film 332_2 may include or be formed of the same material as each other. A boundary between the first spacer film 331_1 and the second spacer film 331_2 and/or a boundary between the third spacer film 332_1 and the fourth spacer film 332_2 may not be distinguished.

The first spacer film 331_1 may include or be formed of a material different from the second spacer film 331_2, and the third spacer film 332_1 may include or be formed of a material different from the fourth spacer film 332_2. For example, each of the first spacer film 331_1 and the third spacer film 332_1 may include or be formed of silicon oxide, and each of the second spacer film 331_2 and the fourth spacer film 332_2 may include or be formed of SiCOH. In still another example, each of the first spacer film 331_1 and the third spacer film 332_1 may include or be formed of SiCOH, and each of the second spacer film 331_2 and the fourth spacer film 332_2 include silicon oxide.

As described above with reference to FIG. 6, the first spacer film 331_1 and the third spacer film 332_1 may be applied in any one of those described for the first spacer 331 and the second spacer 332 of FIGS. 2 to 5.

A thickness of the second spacer film 331_2 on the first spacer film 331_1 and a thickness of the fourth spacer film 332_2 on the third spacer film 332_1 may be, for example, constant. The thickness of the second spacer film 331_2 on the first spacer film 331_1 and the thickness of the fourth spacer film 332_2 on the third spacer film 332_1 may increasingly decrease in the third direction DR3 in still another example.

According to some embodiments, the separation layers (500 of FIGS. 14 to 17) may be further formed between the first spacer film 331_1 and the third spacer film 332_1. The separation layer may include or be formed of, for example, an inhibitor which is used in the inhibitor plasma, which will be described later.

According to some embodiments, the concentration of the inhibitor in the separation layer formed on both side walls of the first trench 331*t* and both side walls of the second trench 332*t* may be the same as or different from the concentration of the inhibitor in the separation layer formed between the first spacer film 331_1 and the second spacer film 331_2, and between the third spacer film 332_1 and the fourth spacer film 332_2.

Figure 7:
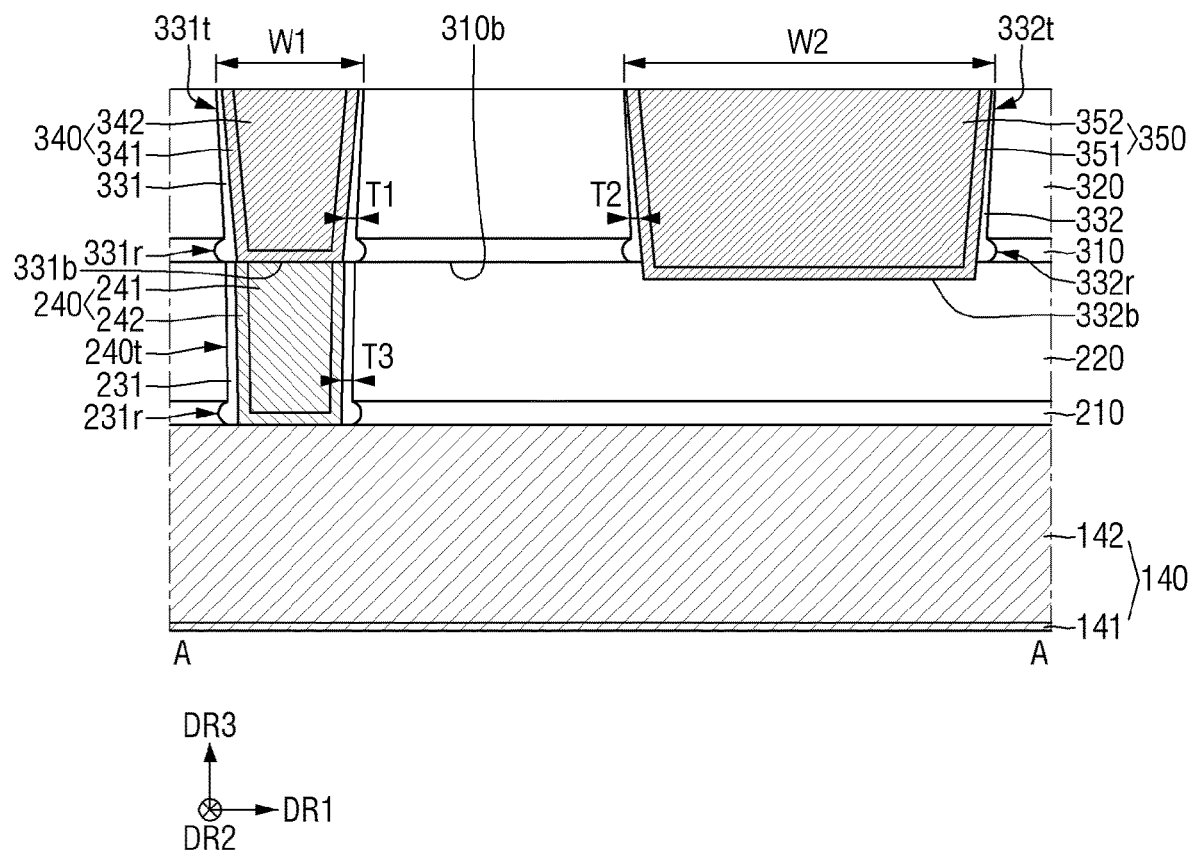

Referring to FIG. 7, in the semiconductor device according to some embodiments, an etching stop film 210 may be disposed between the lower wiring 140 and the first interlayer insulating film 220. The etching stop film 210 according to some embodiments may be a single layer. The etching stop film 210 may include or be formed of, for example, an aluminum (Al) element.

The via trench 240*t* may penetrate the first interlayer insulating film 220 and the etching stop film 210. The portion of the via trench 240*t* that penetrates the etching stop film 210 may include a via recess 231*r*. The via recess 231*r* may be convex toward the etching stop film 210 between the lower wiring 140 and the first interlayer insulating film 220.

A via spacer 231 may be disposed on the side walls of the via trench 240*t*. The via spacer 231 may extend to the upper surface of the lower wiring 140 along the side walls of the via trench 240*t*. The via spacer 231 may fill the via recess 231*r*. The via spacer 231 may expose the bottom surface of the via trench 240*t*.

The via barrier film 242 may extend along the via spacer 231 and the bottom surface of via trench 240*t*. For example, the via spacer 231 may be disposed between the via barrier film 242, the first interlayer insulating film 220, and the etching stop film 210. The entire via spacer 231 may be spaced apart from the first interlayer insulating film 220 by the via spacer 231. The via filling film 241 may fill the via trench 240t on the via spacer 231.

A thickness T3 of the via spacer 231 on the side wall of the via trench 240t may increasingly decrease, as it goes away from the lower wiring 140 (that is, in the third direction DR3). In still another example, the thickness T3 of the via spacer 231 on the side walls of the via trench 240t may be constant.

The thickness T3 of the via spacer 231 on the side walls of the via trench 240t may be greater than, for example, the thickness T2 of the second spacer 332 on the side walls of the second trench 332t. The thickness T3 of the via spacer 231 on the side walls of the via trench 240t and the thickness T2 of the second spacer 332 on the side walls of the second trench 332t may be the values that are measured at the same height point from the etching stop films 210 and 310, respectively.

Alternatively, unlike the shown example, the thickness T3 of the via spacer 231 on the side walls of the via trench 240t may be the same as each of the thickness T2 of the second spacer 332 on the side walls of the second trench 332t and the thickness T1 of the first spacer 331 on the side walls of the first trench 331t.

Figure 8:
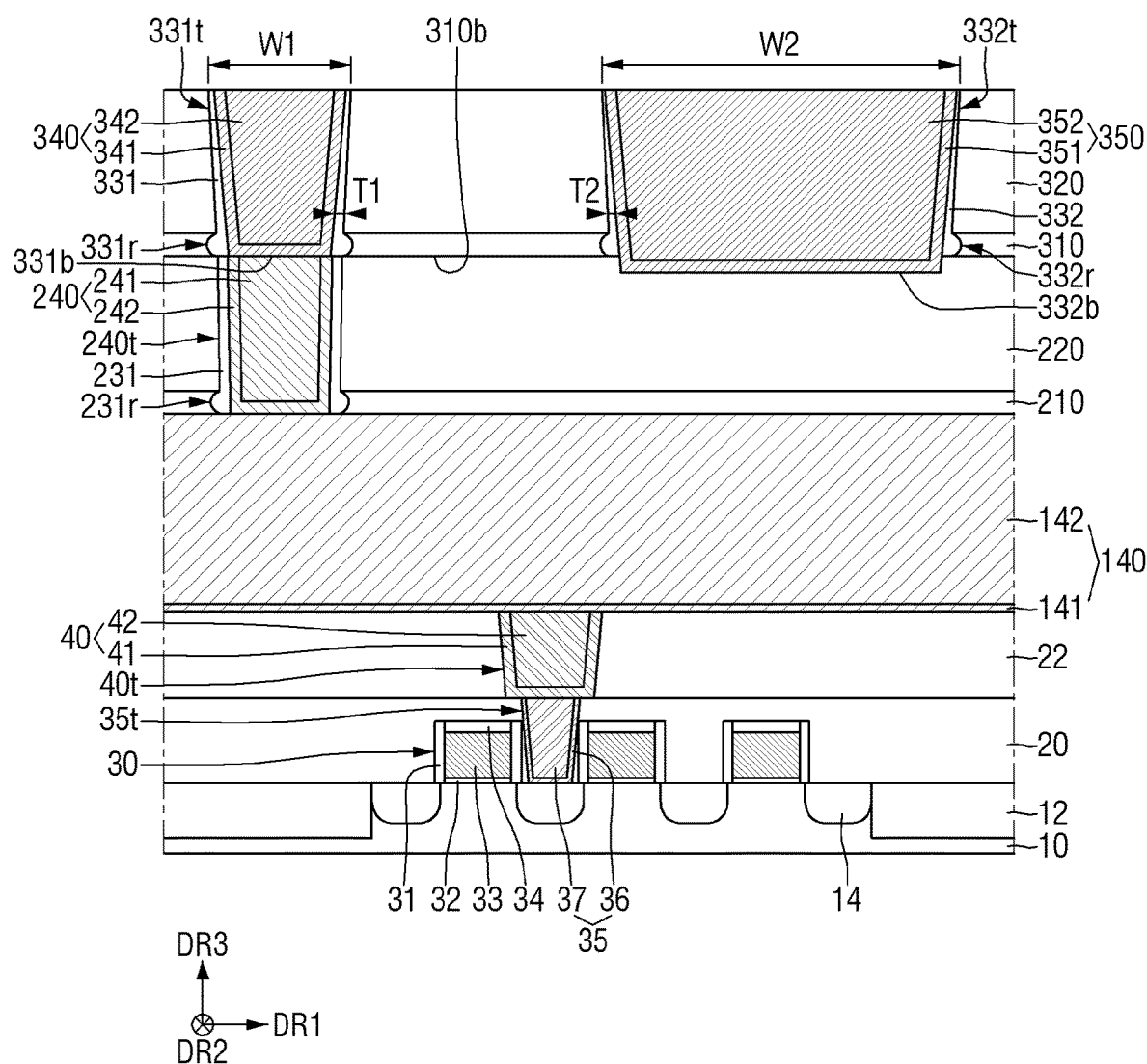

Referring to FIG. 8, in the semiconductor device according to some embodiments, the lower wiring 140 may be a connection wiring formed in a BEOL (Back-end-of-line) process. A lower contact 35 and the upper contact 40 may be contacts or contact wirings formed in a MOL (Middle-of-Line) process.

The substrate 10 may include a field insulating film 12, and an active region defined by the field insulating film 12. The substrate 10 may include or be formed of semiconductor materials such as silicon, germanium and silicon-germanium, or group III-V compounds such as GaP, GaAs, and GaSb. According to some embodiments, the substrate 10 may be a silicon-on-insulator (SOI) substrate or a germanium-on-insulator (GOI) substrate. The field insulating film 12 may include or be formed of, for example, at least one of a silicon oxide film, a silicon nitride film, and a silicon oxynitride film.

A transistor 30 may be disposed on the active region. The transistor 30 may include a gate spacer 31, a gate insulating film 32, a gate electrode 33, a gate capping film 34, and a source/drain 14.

The gate electrode 33 may be disposed on the active region. The gate spacer 31 may be formed on the side wall of the gate electrode 33. The gate insulating film 24 may be formed between the gate electrode 33 and the active region, and between the gate electrode 33 and the gate spacer 31.

The gate capping film 34 may be formed on the gate electrode 33. The gate capping film 34 may be formed between the gate spacers 31. Although an upper surface of the gate capping film 34 may be disposed in the same plane as the upper surface of the gate spacer 31, the present disclosure is not limited thereto. The gate capping film 34 may be formed on the gate electrode 33 and the gate spacer 31. Alternatively, the gate capping film 34 is omitted, and the upper surface of the gate electrode 33 may be disposed in the same plane as the upper surface of the gate spacer 31.

The source/drain 14 may be formed on at least one side of the gate electrode 33. Although the source/drain 14 may be formed inside the substrate 10, the present disclosure is not limited thereto.

A lower interlayer insulating film 20 may be disposed on the substrate 10. The lower interlayer insulating film 20 may cover the transistor 30. The lower interlayer insulating film 20 may include a lower contact trench 35t. The lower contact 35 may fill the lower contact trench 35t. The lower contact 35 may include a lower contact barrier film 36 that extends along the side walls and bottom surface of the lower contact trench 35t, and a lower contact filling film 37 that fills the lower contact trench 35t on the lower contact barrier film 36.

An upper interlayer insulating film 22 may be disposed on the lower interlayer insulating film 20. The upper interlayer insulating film 22 may include an upper contact trench 40t. The upper contact 40 may fill the upper contact trench 40t. The upper contact 40 may include an upper contact barrier film 41 extending along the side walls and bottom surface of the upper contact trench 40t, and an upper contact filling film 42 that fills the upper contact trench 40t on the upper contact barrier film 41.

The lower contact 35 may penetrate the lower interlayer insulating film 20 and electrically connect to the upper contact 40 and the source/drain 14, and the upper contact 40 may penetrate the upper interlayer insulating film 22 and electrically connect to the lower contact 35 and the lower wiring 140.

According to some embodiments, no spacer may be formed between the upper contact 40 and the upper interlayer insulating film 22.

Although the transistor 30 is shown as a planar transistor formed on the substrate 10, the embodiment is not limited thereto. The transistor 30 may, of course, include a fin-type transistor (FinFET) including a channel region of a fin-type pattern shape, a tunneling transistor (tunneling FET), a transistor including a nanowire, a transistor including a nanosheet or a three-dimensional (3D) transistor. Further, the transistor 30 may also include a bipolar junction transistor, a laterally diffused metal oxide semiconductor (LDMOS), or the like.

A semiconductor device according to some embodiments will be described referring to FIG. 9, focusing on points different from those described using FIG. 8.

Figure 9:
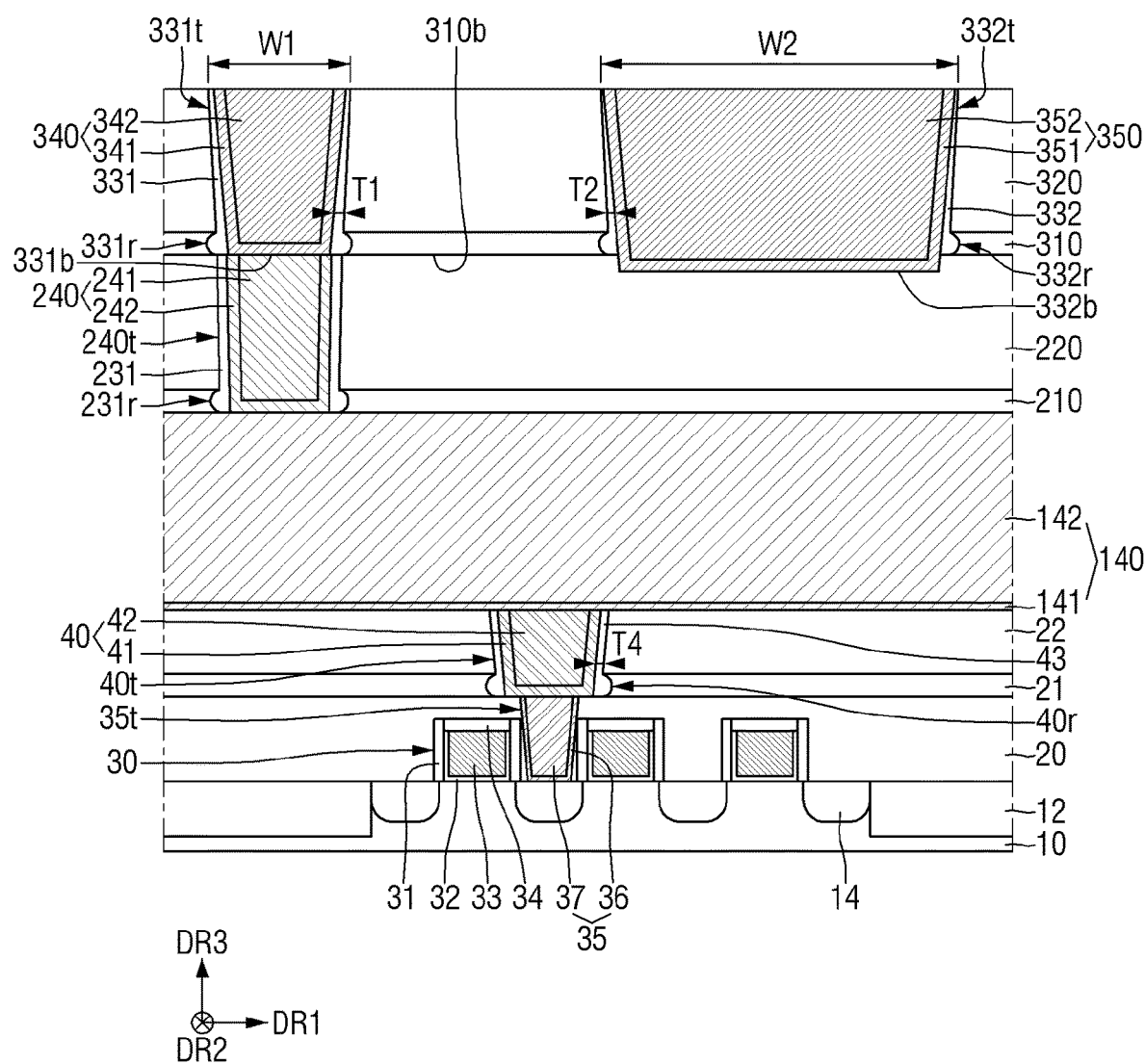

Referring to FIG. 9, in the semiconductor device according to some embodiments, an etching stop film 21 may be formed between the lower interlayer insulating film 20 and the upper interlayer insulating film 22. The etching stop film 21 according to some embodiments may be a single layer. The etching stop film 21 may include or be formed of, for example, an aluminum (Al) element.

The upper contact trench 40t may penetrate the upper interlayer insulating film 22 and the etching stop film 21. A portion of the upper contact trench 40t that penetrates the etching stop film 21 may include a contact recess 40r. The contact recess 40r may be convex toward the etching stop film 21 between the lower interlayer insulating film 20 and the upper interlayer insulating film 22.

The contact spacer 43 may be disposed on the side wall of the upper contact trench 40t. The contact spacer 43 may extend to the upper surface of the lower interlayer insulating film 20 along the side walls of the upper contact trench 40t. The contact spacer 43 may fill the contact recess 40r. The contact spacer 43 may expose a bottom surface of the upper contact trench 40t.

For example, a thickness T4 of the contact spacer 43 on the side walls of the upper contact trench 40t may increasingly decrease as it goes away from the lower interlayer insulating film 20 (that is, in the third direction DR3). In still another example, the thickness T4 of the contact spacer 43 on the side walls of the upper contact trench 40t may be constant.

The upper contact 40 may fill the upper contact trench 40t on the contact spacer 43.

Unlike the shown example, no spacer may be formed between the lower contact 35 and the lower interlayer insulating film 20.

Figure 10:
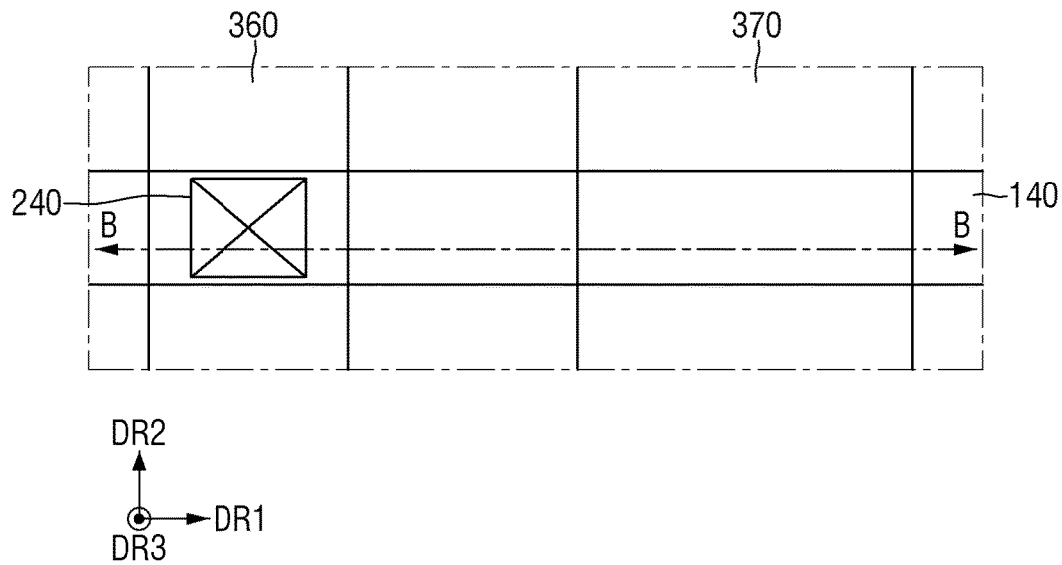
FIG. 10 is a schematic layout diagram for explaining the semiconductor device according to some embodiments.
Figure 11:
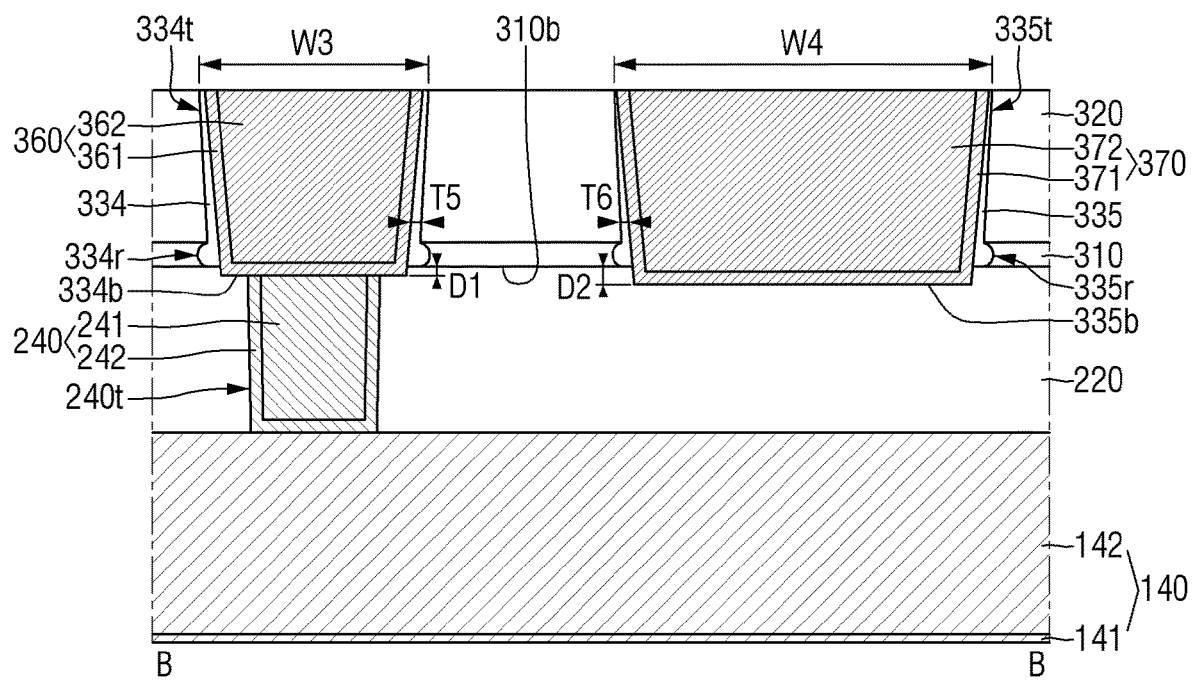
FIG. 11 is a cross-sectional view taken along B-B of FIG. 10 according to some embodiments.

FIG. 10 is a schematic layout diagram for explaining a semiconductor device according to some embodiments. FIG. 11 is a cross-sectional view taken along B-B of FIG. 10 according to some embodiments. For convenience of explanation, points different from those described using FIGS. 1 and 2 will be mainly described.

Referring to FIGS. 10 and 11, in the semiconductor device according to some embodiments, a width W3 of a third trench 334t in the first direction DR1 may be different from a width W4 of a fourth trench 335t. The width W3 of the third trench 334t in the first direction DR1 may be smaller than the width W4 of the fourth trench 335t. The width W3 of the third trench 334t and the width W4 of the fourth trench 335t may be the values that are measured at the same height point from the etching stop film 310. The width W3 of FIG. 11 may be greater than the width W1 of FIG. 2.

A thickness T6 of a fourth spacer 335 on the side wall of the fourth trench 335t may be smaller than a thickness T5 of a third spacer 334 on the side wall of the third trench 334t. The thickness T6 of the fourth spacer 335 on the side wall of the fourth trench 335t and the thickness T5 of the third spacer 334 on the side wall of the third trench 334t may be the values that are measured at the same high point from the etching stop film 310. The thickness T5 of FIG. 11 may be smaller than the thickness T1 of FIG. 2.

In some embodiments, a bottom surface 335b of the fourth trench 335t and a bottom surface 334b of the third trench 334t may be disposed below the bottom surface 310b of the etching stop film 310. The bottom surface 335b of the fourth trench 335t and the bottom surface 334b of the third trench 334t may be disposed inside the first interlayer insulating film 220. The bottom surface 335b of the fourth trench 335t may be disposed below the bottom surface 334b of the third trench 334t. For example, the maximum distance D1 from the bottom surface 310b of the etching stop film 310 to the bottom surface 334b of the third trench 334t may be smaller than the maximum distance D2 from the bottom surface 310b of the etching stop film 310 to the bottom surface 335b of the fourth trench 335t. The maximum distances D1 and D2 may be the values that are measured at the same point of the bottom surface 310b of the etching stop film 310.

A third upper wiring 360 may fill the third trench 334t on the third spacer 334, and a fourth upper wiring 370 may fill the fourth trench 335t on the fourth spacer 335. Accordingly, the resistance of the third upper wiring 360 and the fourth upper wiring 370 may decrease, and the RC delay of the semiconductor device may be reduced.

In some embodiments, the third upper wiring 360 may include a third barrier film 361 and a third filling film 362, and the fourth upper wiring 370 may include a fourth barrier film 371 and a fourth filling film 372.

Specific explanations of the third spacer 334, a third recess 334r, the third upper wiring 360, the third barrier film 361, and the third filling film 362 may be the same as above explanations of the first spacer 331, the first upper wiring 340, the first barrier film 341, and the first filling film 342 of FIG. 2. Specific explanations of the fourth spacer 335, a fourth recess 335r, the fourth upper wiring 370, the fourth barrier film 371 and the fourth filling film 372 may be the same as above explanations of the second spacer 332, the second recess 332r, the second upper wiring 350, the second barrier film 351 and the second filling film 352 of FIG. 2.

FIGS. 12 to 17 are intermediate stage diagrams for explaining a method for fabricating the semiconductor device according to some embodiments. For reference, FIGS. 12 to 17 are cross-sectional views taken along A-A of FIG. 1.

Figure 12:
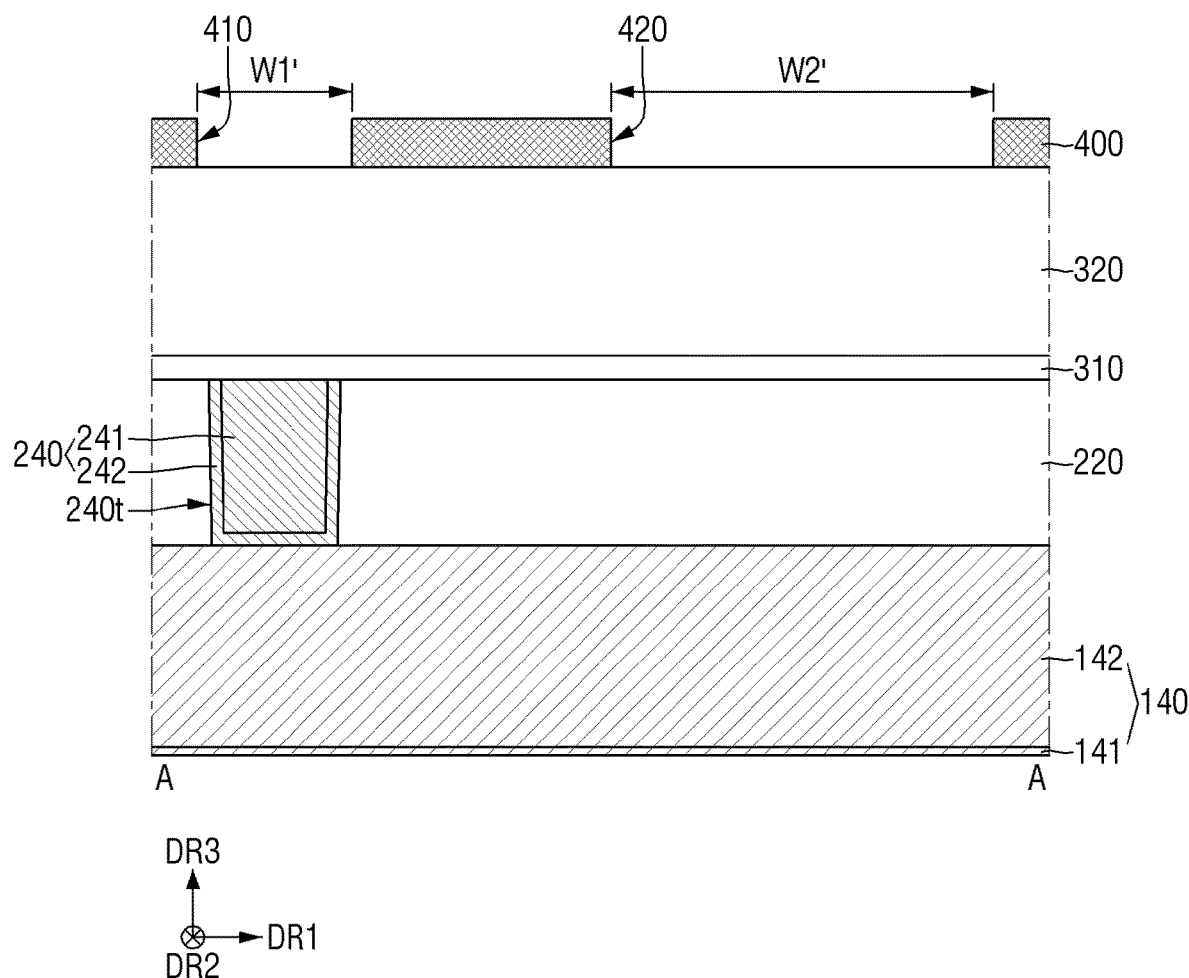
FIGS. 12 to 17 are intermediate stage diagrams for explaining a method for fabricating the semiconductor device according to some embodiments.

Referring to FIG. 12, the first interlayer insulating film 220 in which the via 240 is formed may be formed on the lower wiring 140. The etching stop film 310 and the second interlayer insulating film 320 may be sequentially formed on the first interlayer insulating film 220.

The etching stop film 310 may have an etching selectivity with respect to the second interlayer insulating film 320. The thickness of the etching stop film 310 on the second interlayer insulating film 320 may be, for example, about 25 Å or more and 40 Å or less.

A mask pattern 400 may be formed on the second interlayer insulating film 320. The mask pattern 400 may include a first opening 410 and a second opening 420 that expose the upper surface of the second interlayer insulating film 320. A width W1' of the first opening 410 may be smaller than a width W2' of the second opening 420.

The mask pattern 400 may include or be formed of, for example, metals such as titanium, titanium nitride, titanium oxide, tungsten, tungsten nitride, tungsten oxide, tantalum, tantalum nitride and tantalum oxide, metal nitride, metal oxide and the like.

Figure 13:
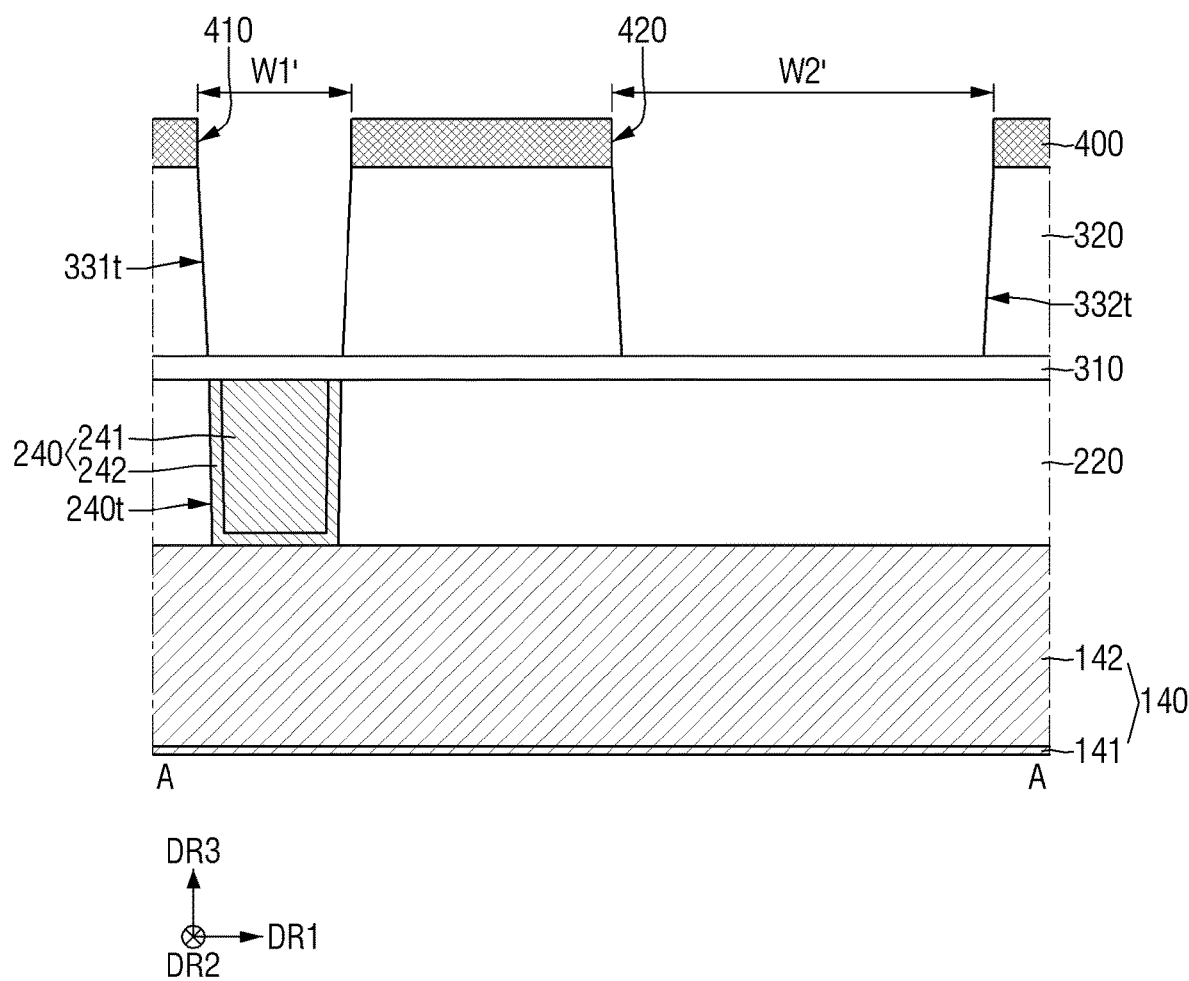

Referring to FIG. 13, an etching process may be performed on the second interlayer insulating film 320, using the mask pattern 400. Accordingly, a first trench 331t and a second trench 332t having different widths from each other may be formed inside the second interlayer insulating film 320. The first trench 331t may correspond to the first opening 410, and the second trench 332t may correspond to the second opening 420. The first trench 331t and the second trench 332t may expose the etching stop film 310.

Figure 14:
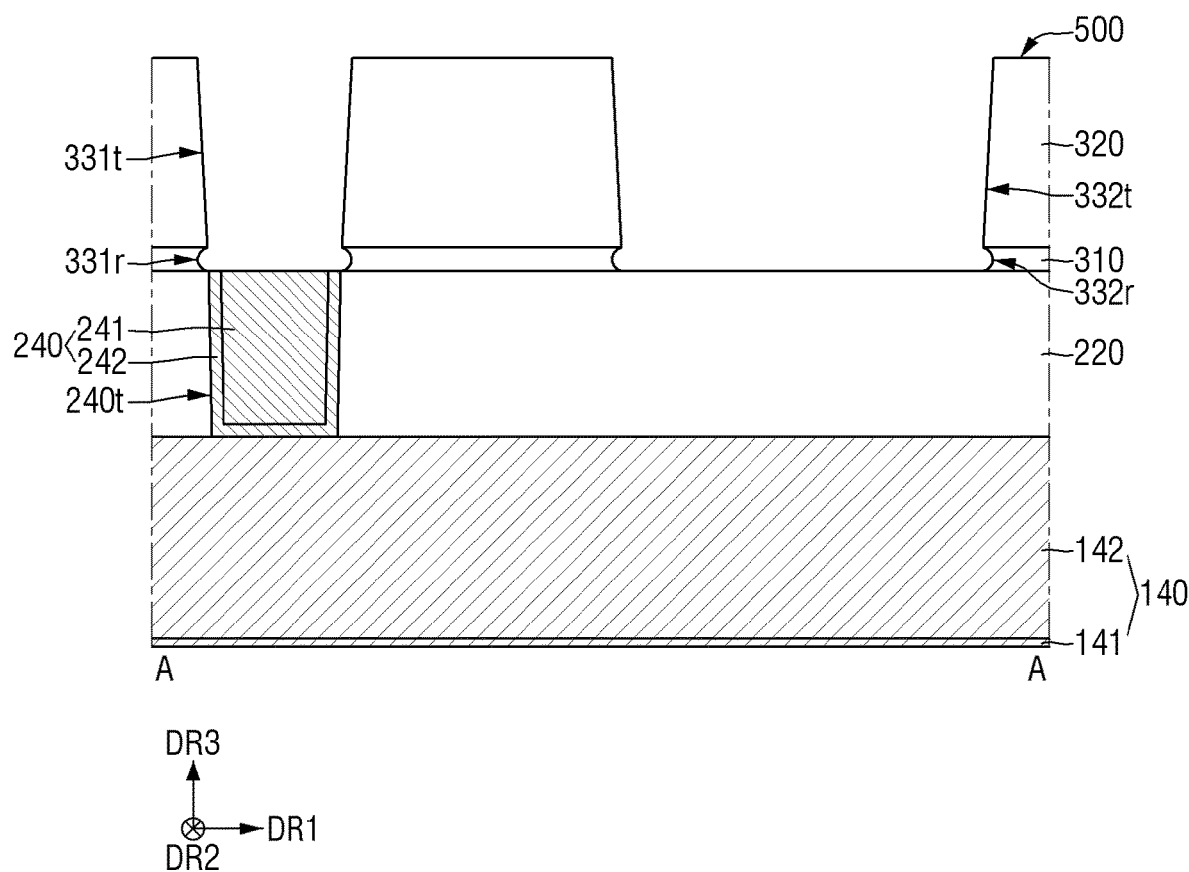

Referring to FIG. 14, a cleaning process may be performed on the etching stop film 310 exposed by the first trench 331t and the second trench 332t. The etching by-products in the first trench 331t and the second trench 332t may be removed accordingly. At this time, the mask pattern (400 of FIG. 13) may also be removed together.

The cleaning process may be performed, for example, through a wet etching process that uses a solution containing hydrofluoric acid (HF).

At this time, the etching stop film 310 may be removed in the first direction DR1 by the wet etching process to form the first recess 331r and the second recess 332r. The first recess 331r may be formed in the etching stop film 310 exposed by the first trench 331t, and the second recess 332r may be formed in the etching stop film 310 exposed by the second trench 332t.

Subsequently, according to some embodiments, the second interlayer insulating film 320, the etching stop film 310 and the via 240 exposed by the first trench 331t, and the etching stop film 310 and the first interlayer insulating film 220 exposed by the second trench 332t may be exposed to the inhibitor plasma, thereby forming the separation layer 500. The inhibitor plasma may generate a passivated surface to suppress the formation of a pre spacer 330 that will be deposited later. For example, the separation layer 500 may be formed, by exposing the second interlayer insulating film 320, the etching stop film 310 and the via 240 exposed by the first trench 331t, and the etching stop film 310 and the first interlayer insulating film 220 exposed by the second trench 332t to the inhibitory plasma, during a first time.

Because the width of the first trench 331t is smaller than the width of the second trench 332t, the bottom surface of the first trench 331t may be subjected to lesser plasma treatment than the bottom surface of the second trench 332t. According to the embodiments, because the width of the first trench 331t is small, the bottom surface of the first trench 331t may not be subjected to plasma treatment.

The bottom surface of the second trench 332t may be subjected to lesser plasma treatment than the upper surface of the second interlayer insulating film 320. According to the embodiment, since the width of the second trench 332t is large, the bottom surface of the second trench 332t may be subjected to plasma treatment in the same manner as the upper surface of the second interlayer insulating film 320.

Due to the shapes of the first trench 331t and the second trench 332t, the side wall of the first trench 331t and the side wall of the second trench 332t may be subjected to a less plasma treatment as they approach the first interlayer insulating film 220. Further, the side wall of the first trench 331t may be subjected to lesser plasma treatment than the side wall of the second trench 332t.

According to some embodiments, molecular nitrogen ($N_2$) may be used as a source gas for the inhibitor plasma. As another example, the source gas of the inhibitor plasma may be selected from a group including molecular nitrogen ($N_2$), argon (Ar), helium (He), molecular hydrogen ($H_2$), ammonia ($NH_3$) or a combination thereof.

Figure 15:
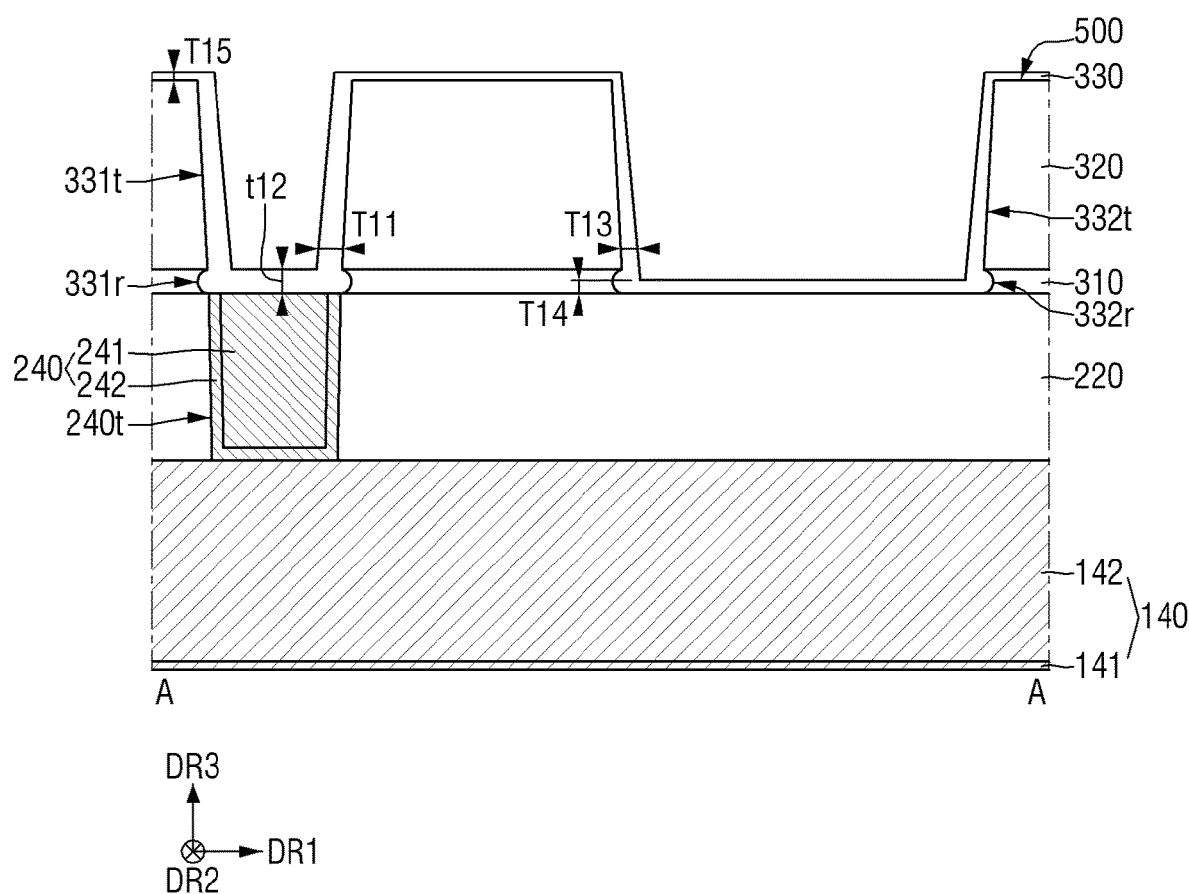

Referring to FIG. 15, an atomic layer deposition (ALD) cycle may be performed on the separation layer 500. Accordingly, a pre spacer 330 may be formed along the upper surface of the second interlayer insulating film 320, the side wall and bottom surface of the first trench 331t, and the side wall and bottom surface of the second trench 332t. The pre spacer 330 may fill the first recess 331r and the second recess 332r.

At this time, because the bottom surface of the first trench 331t was subjected to lesser plasma treatment than the bottom surface of the second trench 332t, a thickness T12 of the pre spacer 330 formed on the bottom surface of the first trench 331t may be greater than a thickness T14 of the pre spacer 330 formed on the bottom surface of the second trench 332t.

Because the bottom surface of the second trench 332t was subjected to lesser plasma treatment than the upper surface of the second interlayer insulating film 320, the thickness T14 of the pre spacer 330 formed on the bottom surface of the second trench 332t may be greater than a thickness T15 of the pre spacer 330 formed on the upper surface of the second interlayer insulating film 320. According to some embodiments, the thickness T14 of the pre spacer 330 formed on the bottom surface of the second trench 332t may be the same as the thickness T15 of the pre spacer 330 formed on the upper surface of the second interlayer insulating film 320.

Since the side wall of the first trench 331t is subjected to lesser plasma treatment than the side wall of the second trench 332t, the thickness T11 of the pre spacer 330 formed on the side wall of the first trench 331t may be greater than the thickness T13 of the pre spacer 330 formed on the side wall of the second trench 332t.

Because the side wall of the first trench 331t and the side wall of the second trench 332t were subjected to the less plasma treatment as they approach the first interlayer insulating film 220, the thickness T11 of the pre spacer 330 formed on the side wall of the first trench 331t and the thickness T13 of the pre spacer 330 formed on the side wall of the second trench 332t may be large as they approach the first interlayer insulating film 220.

In explaining an embodiment of the present disclosure, the formation of the separation layer 500 prior to the execution of the ALD cycle for the deposition of the pre spacer 330, that is, the execution of the inhibitor plasma treatment is described. However, this is an example, and the disclosure is not limited thereto. For example, the separation layer 500 is not formed before the first ALD cycle (or vapor deposition of the first pre spacer 330), but the separation layer 500 may be formed after at least one ALD cycle is performed.

Further, the execution of the ALD cycle after the inhibitor plasma treatment may be performed, for example, a plurality of times. Accordingly, the separation layer 500 and the pre spacer 300 may be alternately stacked a plurality of times. Further, when the ALD cycle is performed a plurality of times after the inhibitor plasma treatment is performed, the times for performing each inhibitor plasma may be different or the same.

Further, in explaining the embodiment of the present disclosure, although the pre spacer 330 is formed by ALD, this is an example, and the present disclosure is not limited thereto. For example, the pre spacer 330 may be formed through a SOG (Spin On Glass) process or a chemical vapor deposition (CVD) process. In exemplary embodiments, the chemical vapor deposition may include, for example, an atmospheric pressure chemical vapor deposition (AP-CVD) process, a low pressure chemical vapor deposition (LP-CVD) process, a plasma chemical vapor deposition (PE-CVD) process or a high density plasma chemical vapor deposition (HDP-CVD) process.

Figure 16:
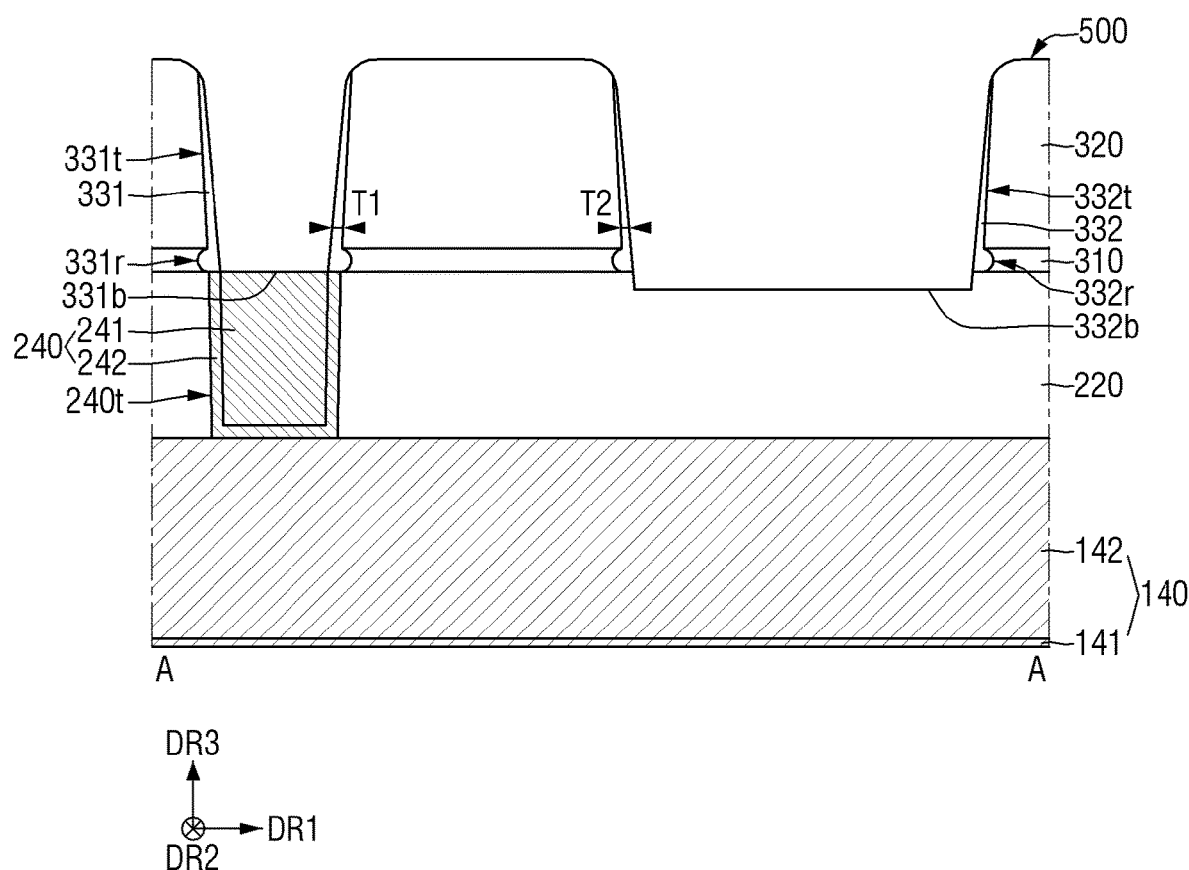

Referring to FIG. 16, a top corner rounding (TCR) process may be performed on the second interlayer insulating film 320. The pre spacer 330 and the second interlayer insulating film 200 may be etched together. Accordingly, the pre spacer 330 may be etched to expose the upper surface of the second interlayer insulating film 320, and by etching a part of the upper part of the second interlayer insulating film 320, the upper side walls of the interlayer insulating film 320 may be rounded. According to some embodiments, the upper surface of the first spacer 331 and/or the second spacer 332 may also be rounded.

Subsequently, a cleaning process may be performed on the pre spacer 330 on the bottom surface of the first trench 331t and the bottom surface of the second trench 332t. Accordingly, the upper surface of the via 240 and the upper surface of the first interlayer insulating film 220 may be exposed, and the etching by-products in the first trench 331t and the second trench 332t may be removed.

The cleaning process may be performed, for example, through a wet etching process that uses a solution containing hydrofluoric acid (HF).

Accordingly, the pre spacer 330 is etched, the first spacer 331 that fills the first recess 331r may be formed on the side wall of the first trench 331t, and the second spacer 332 that fills the second recess 332r may be formed on the side wall of the second trench 332t. The first spacer 331 may expose at least a part of the upper surface of the via 240, and the second spacer 332 may expose at least a part of the upper surface of the first interlayer insulating film 220.

At this time, since the first spacer 331 that fills the first recess 331r and the second spacer 332 that fills the second recess 332r cover the etching stop film 310, the etching stop film 310 may not be removed by the top corner rounding process and/or the cleaning process in the first direction DR1.

For example, although an inclination of the side wall of the first trench 331t defined by the second interlayer insulating film 320 may be different from an inclination of the side wall of the second trench 332t defined by the second interlayer insulating film 320, the disclosure is not limited thereto.

Because the thickness T14 of the pre spacer 330 formed on the bottom surface of the second trench 332t is smaller than the thickness T12 of the pre spacer 330 formed on the bottom surface of the first trench 331t, at least a part of the first interlayer insulating film 220 exposed by the first trench 331t may be etched. Therefore, the bottom surface 332b of the second trench 332t may be disposed below the bottom surface 331b of the first trench 331t.

Because the thickness T11 of the pre spacer 330 formed on the side wall of the first trench 331t is greater than the thickness T13 of the pre spacer 330 formed on the side wall of the second trench 332t, the thickness T1 of the first spacer 331 on the side walls of the first trench 331t may be greater than the thickness T2 of the second spacer 332 on the side walls of the second trench 332t.

According to some embodiments, the thickness T1 of the first spacer 331 on the side walls of the first trench 331t may be the same as the thickness T2 of the second spacer 332 on the side walls of the second trench 332t.

Because the thickness T11 of the pre spacer 330 formed on the side wall of the first trench 331t and the thickness T13 of the pre spacer 330 formed on the side wall of the second trench 332t are large as they approach the first interlayer insulating film 220, the thickness T1 of the first spacer 331 on the side walls of the first trench 331t and the thickness T2 of the second spacer 332 on the side walls of the second trench 332t may increase as they approach the first interlayer insulating film 220.

According to some embodiments, the thickness T1 of the first spacer 331 on the side walls of the first trench 331t and the thickness T2 of the second spacer 332 on the side walls of the second trench 332t may be constant.

Figure 17:
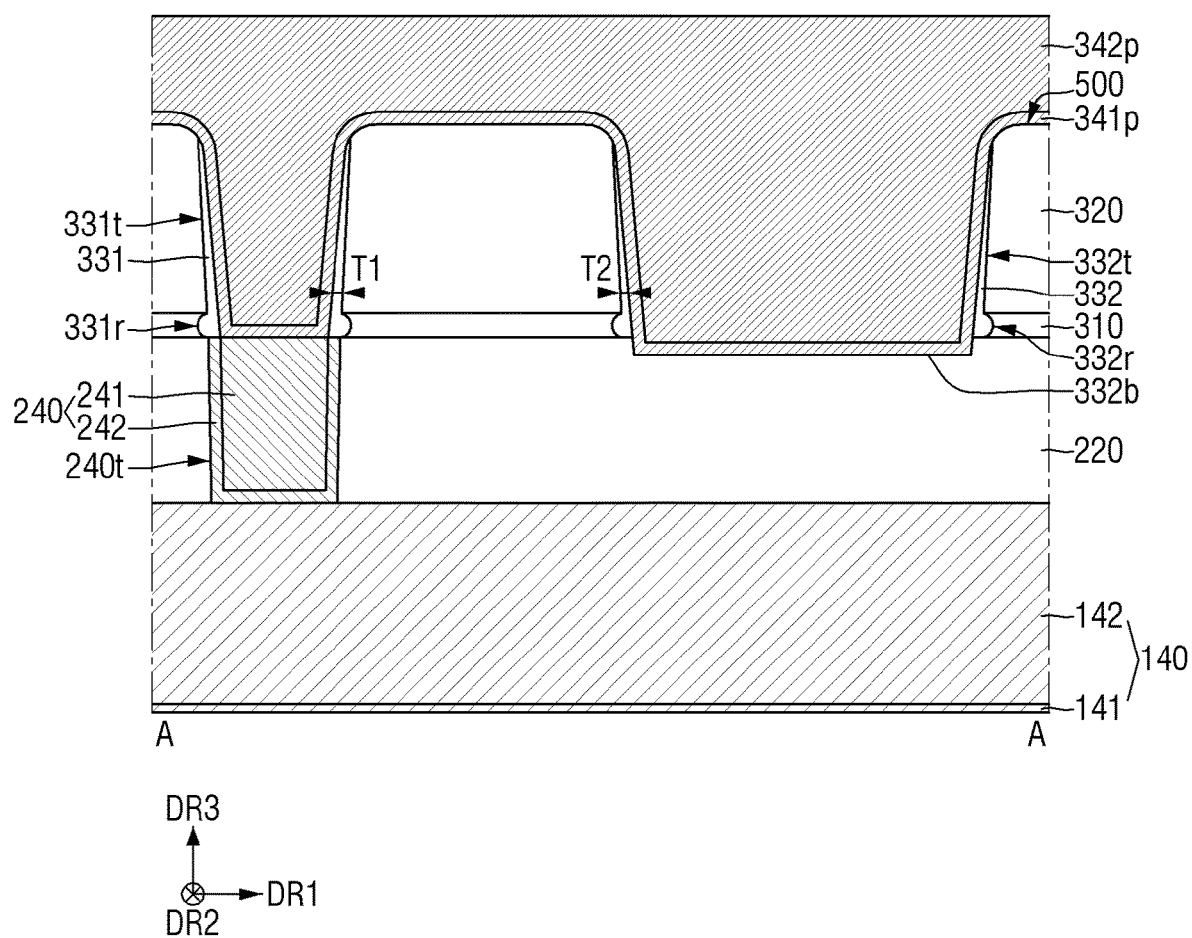

Referring to FIG. 17, a pre barrier film 341p and a pre filling film 342p may be formed.

The pre barrier film 341p may be formed along the upper surface of the second interlayer insulating film 320, the side walls of the first spacer 331, the bottom surface 331b of the first trench 331t, the side wall of the second spacer 332 and the bottom surface 332b of the second trench 332t. For example, the pre barrier film 341p may be formed conformally to have a certain thickness along the upper surface of the second interlayer insulating film 320, the side walls of the first spacer 331, the bottom surface 331b of the first trench 331t, the side walls of the second spacer 332, and the bottom surface 332b of the second trench 332t.

The pre filling film 342p may be formed on the pre barrier film 341p. The pre filling film 342p may fill the first trench 331t and the second trench 332t, and may cover the second interlayer insulating film 320.

For example, the pre filling film 342p may be formed by forming a seed film (not shown) on the pre barrier film 341p and then performing an electroplating method.

According to some embodiments, a liner (not shown) may be further formed on the pre barrier film 341p before forming the pre filling film 342p. The liner may include or be formed of, for example, cobalt, ruthenium and the like.

Referring to FIG. 2, the first upper wiring 340 that fills the first trench 331t and the second upper wiring 350 that fills the second trench 332t may be formed, by flattening the pre barrier film 341p and the pre filling film 342p until the upper surface of the second interlayer insulating film 320 is exposed. According to some embodiments, the upper part of the first spacer 331 and the upper part of the second spacer 332 may be removed together with the second interlayer insulating film 320 at the time of the flattening process.

For example, the flattening process may be performed through a chemical mechanical polishing (CMP) process and/or an etchback process.

Alternatively, referring to FIG. 5, according to some embodiments, the second interlayer insulating film 320 is removed at the time of the flattening process, and the rounded upper part of the first spacer 331 and the rounded upper part of the second spacer 332 may remain.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor device comprising:
   an etching stop film which is disposed on a substrate;
   an interlayer insulating film which is disposed on the etching stop film;
   a trench which penetrates the interlayer insulating film and the etching stop film;
   a spacer which extends along side walls of the trench;
   a barrier film which extends along the spacer and a bottom surface of the trench; and
   a filling film which fills the trench on the barrier film,
   wherein the trench includes a first trench and a second trench which are spaced apart from each other in a first direction and have different widths from each other in the first direction, and
   wherein a bottom surface of the second trench is disposed below a bottom surface of the first trench.

2. The semiconductor device of claim 1, wherein, in the first direction, a width of the first trench is smaller than a width of the second trench.

3. The semiconductor device of claim 1, wherein the bottom surface of the second trench is disposed below a bottom surface of the etching stop film.

4. The semiconductor device of claim 3, wherein the second trench penetrates at least a part of the substrate, and
   wherein the spacer extends along side walls of the second trench that penetrates the interlayer insulating film, and does not extend along the side walls of the second trench that penetrates the substrate.

5. The semiconductor device of claim 1, wherein a thickness of the spacer on the side walls of the trench decreases as the spacer goes away from the substrate.

6. The semiconductor device of claim 1, wherein the trench further includes a recess which is convex toward the etching stop film between the interlayer insulating film and the etching stop film, and
   wherein the spacer fills the recess.

7. The semiconductor device of claim 1, wherein the spacer includes a first spacer extending along the side walls of the first trench, and a second spacer extending along the side walls of the second trench, and
   wherein a thickness of the first spacer on the side walls of the first trench is different from a thickness of the second spacer on the side walls of the second trench.

8. The semiconductor device of claim 1, wherein the spacer includes a first spacer extending along the side walls of the first trench, and a second spacer extending along the side walls of the second trench, and wherein a thickness of the first spacer on the side walls of the first trench is the same as a thickness of the second spacer on the side walls of the second trench.

9. The semiconductor device of claim 1, wherein the spacer includes a first spacer film extending along the side walls of the trench, and a second spacer film disposed between the first spacer film and the barrier film.

10. The semiconductor device of claim 9, wherein the first spacer film includes the same material as the second spacer film.

11. The semiconductor device of claim 9, wherein the first spacer film includes a material different from the second spacer film.

12. The semiconductor device of claim 1, wherein the entire of the barrier film is spaced apart from the interlayer insulating film by the spacer.

13. The semiconductor device of claim 1, wherein an upper side wall of the spacer is rounded.

14. A semiconductor device comprising:
a first interlayer insulating film which includes a via;
an etching stop film which is disposed on the first interlayer insulating film;
a second interlayer insulating film which is disposed on the etching stop film;
a first trench which penetrates at least a part of the second interlayer insulating film and the etching stop film, and includes a first recess which is convex toward the etching stop film between the first interlayer insulating film and the second interlayer insulating film;
a first spacer which extends along side walls of the first trench and fills the first recess; and
a first wiring which fills the first trench on the first spacer,
wherein the first spacer is disposed between the second interlayer insulating film and the first wiring, and is not disposed between the first interlayer insulating film and the first wiring.

15. The semiconductor device of claim 14, wherein a thickness of the first spacer decreases as the first spacer goes away from the first interlayer insulating film.

16. The semiconductor device of claim 14, further comprising:
a second trench which is spaced apart from the first trench in a first direction, penetrates at least a part of the second interlayer insulating film, the etching stop film, and the first interlayer insulating film, and includes a second recess which is convex toward the etching stop film between the first interlayer insulating film and the second interlayer insulating film;
a second spacer which extends along side walls of the second trench and fills the second recess; and
a second wiring which fills the second trench on the second spacer,
wherein a width of the second trench is greater than a width of the first trench in the first direction, and
wherein a bottom surface of the second trench is disposed below a bottom surface of the first trench.

17. The semiconductor device of claim 16, wherein at a first height point from the etching stop film, a thickness of the first spacer on the side walls of the first trench is greater than a thickness of the second spacer on the side walls of the second trench.

18. The semiconductor device of claim 16, wherein the second spacer is disposed between the second interlayer insulating film and the second wiring, and is not disposed between the first interlayer insulating film and the second wiring.

19. The semiconductor device of claim 14, wherein the first spacer includes a first spacer film and a second spacer film, which are sequentially disposed between the second interlayer insulating film and the first wiring.

20. A semiconductor device comprising:
a first interlayer insulating film which includes a via;
an etching stop film which is disposed on the first interlayer insulating film;
a second interlayer insulating film which is disposed on the etching stop film;
a first trench which penetrates the second interlayer insulating film and the etching stop film, and includes a first recess that is convex toward the etching stop film between the first interlayer insulating film and the second interlayer insulating film;
a second trench which is spaced apart from the first trench in a first direction, penetrates at least a part of the second interlayer insulating film, the etching stop film and the first interlayer insulating film, and includes a second recess that is convex toward the etching stop film between the first interlayer insulating film and the second interlayer insulating film;
a first spacer which extends along side walls of the first trench and fills the first recess;
a first barrier film which extends along the first spacer and a bottom surface of the first trench exposed by the first spacer;
a first filling film which fills the first trench on the first barrier film;
a second spacer which extends along side walls of the second trench and fills the second recess;
a second barrier film which extends along the second spacer and a bottom surface and side walls of the second trench exposed by the second spacer; and
a second filling film which fills the second trench on the second barrier film,
wherein a width of the first trench in the first direction is smaller than a width of the second trench,
wherein the bottom surface of the first trench is disposed above the bottom surface of the second trench, and
wherein, at a first height point from the etching stop film, a thickness of the first spacer on the side walls of the first trench is greater than a thickness of the second spacer on the side walls of the second trench.

* * * * *